(12) United States Patent
Adam et al.

(10) Patent No.: US 8,900,934 B2
(45) Date of Patent: Dec. 2, 2014

(54) FINFET DEVICES CONTAINING MERGED EPITAXIAL FIN-CONTAINING CONTACT REGIONS

(71) Applicant: International Business Machines Corporation, Armonk, NY (US)

(72) Inventors: Thomas N. Adam, Slingerlands, NY (US); Veeraraghavan S. Basker, Schenectady, NY (US); Jinghong Li, Poughquag, NY (US); Chung-Hsun Lin, White Plains, NY (US); Sebastian Naczas, Albany, NY (US); Alexander Reznicek, Troy, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/865,519

(22) Filed: Apr. 18, 2013

(65) Prior Publication Data

US 2014/0312419 A1 Oct. 23, 2014

(51) Int. Cl.
  *H01L 21/00* (2006.01)
  *H01L 27/12* (2006.01)
  *H01L 29/66* (2006.01)

(52) U.S. Cl.
  CPC ...... *H01L 27/1211* (2013.01); *H01L 29/66795* (2013.01)
  USPC ............ 438/149; 438/479; 438/517; 257/347

(58) Field of Classification Search
  CPC ............... H01L 21/823431; H01L 21/845; H01L 27/0886; H01L 27/0924; H01L 27/10826; H01L 27/10879; H01L 27/1211; H01L 29/41791; H01L 29/66795; H01L 29/7831; H01L 29/785; H01L 2029/785; H01L 2029/7858; H01L 2924/13067
  USPC ........................... 438/149, 479, 517; 257/347
  See application file for complete search history.

(56) References Cited

U.S. PATENT DOCUMENTS

| | | |
|---|---|---|
| 6,642,090 B1 | 11/2003 | Fried et al. |
| 6,787,476 B1 | 9/2004 | Dukshina-Murthy et al. |
| 7,388,259 B2 | 6/2008 | Doris et al. |
| 7,642,162 B2 | 1/2010 | Matsu |
| 7,915,682 B2 | 3/2011 | Hsu et al. |
| 8,039,349 B2 | 10/2011 | Hargrove et al. |
| 8,106,459 B2 | 1/2012 | Chang et al. |

(Continued)

OTHER PUBLICATIONS

Office Action dated Feb. 10, 2014 received in related U.S. Patent Application, namely U.S. Appl. No. 14/029,306.

*Primary Examiner* — Jarrett Strark
*Assistant Examiner* — Mohammad M Hoque
(74) *Attorney, Agent, or Firm* — Scully, Scott, Murphy & Presser, P.C.; Daniel P. Morris, Esq.

(57) ABSTRACT

A plurality of semiconductor fins are formed which extend from a semiconductor material portion that is present atop an insulator layer of a semiconductor-on-insulator substrate. A gate structure and adjacent gate spacers are formed that straddle each semiconductor fin. Portions of each semiconductor fin are left exposed. The exposed portions of the semiconductor fins are then merged by forming an epitaxial semiconductor material from an exposed semiconductor material portion that is not covered by the gate structure and gate spacers.

17 Claims, 5 Drawing Sheets

(56) References Cited

U.S. PATENT DOCUMENTS

| | | |
|---|---|---|
| 2005/0167650 A1* | 8/2005 | Orlowski et al. ............... 257/16 |
| 2007/0075372 A1* | 4/2007 | Terashima et al. ............ 257/360 |
| 2010/0184261 A1 | 7/2010 | Yagishita |
| 2011/0127610 A1 | 6/2011 | Lee et al. |
| 2011/0147812 A1 | 6/2011 | Steigerwald et al. |
| 2012/0282743 A1* | 11/2012 | Saitoh et al. .................. 438/152 |
| 2013/0285153 A1 | 10/2013 | Lee et al. |
| 2014/0027860 A1* | 1/2014 | Glass et al. ................... 257/401 |

* cited by examiner

FINFET DEVICES CONTAINING MERGED EPITAXIAL FIN-CONTAINING CONTACT REGIONS

BACKGROUND

The present application relates to a semiconductor device and a method of forming the same. More particularly, the present application relates to finFET devices and methods of forming the same.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. In view of the possibility of scaling reaching its limits, other semiconductor geometries, such as fin field effect transistors (finFETs) have been considered.

SUMMARY

A plurality of semiconductor fins are formed which extend upward from a semiconductor material portion that is present atop an insulator layer of a semiconductor-on-insulator substrate. A gate structure and adjacent gate spacers are formed that straddle each semiconductor fin. Portions of each semiconductor fin (not including the gate structure and gate spacers) are left exposed. The exposed portions of the semiconductor fins are then merged by forming an epitaxial semiconductor material from an exposed semiconductor material portion that is not covered by the gate structure and gate spacers.

In one embodiment of the present application, a method of forming a semiconductor device is provided. The method of this embodiment of the present application includes providing a structure comprising a topmost semiconductor layer located on a surface of an insulator layer. Next, the topmost semiconductor layer is partially etched to form a plurality of semiconductor fins extending upward from a topmost surface of a semiconductor material portion. A gate structure and adjacent gate spacers are then formed straddling each semiconductor fin. Next, a semiconductor material is epitaxially grown from an exposed surface of the semiconductor material portion which is located between each adjacent semiconductor fin. In accordance with the present application, the semiconductor material that is epitaxially grown merges exposed portions of each adjacent semiconductor fin.

In another embodiment, another method of forming a semiconductor device is provided. The another method of the present application includes providing a structure comprising, from bottom to top, an insulator material, a semiconductor etch stop material and a topmost semiconductor layer, wherein the semiconductor etch stop material comprises a semiconductor material having a different etch rate than the topmost semiconductor layer. The topmost semiconductor layer is then etched, stopping on an uppermost surface of the semiconductor etch stop material, to form a plurality of semiconductor fins. Next, a gate structure and adjacent gate spacers are formed straddling each semiconductor fin. A semiconductor material is then epitaxially grown from an exposed surface of the semiconductor etch stop material which is located between each adjacent semiconductor fin. In accordance with the present application, the semiconductor material merges exposed portions of each adjacent semiconductor fin.

In another aspect of the present application, a semiconductor device is provided. The semiconductor device of the present application includes a plurality of semiconductor fins extending upward from a topmost surface of a semiconductor material portion, wherein the semiconductor material portion is located on an upper surface of an insulator layer. The semiconductor device also includes a functional gate structure straddling each semiconductor fin and a gate spacer located on each sidewall of the functional gate structure and also straddling each semiconductor fin. The semiconductor device also includes a semiconductor material located on each side of the functional gate structure and present on an exposed surface of the semiconductor material portion between each adjacent semiconductor fin, wherein the semiconductor material merges exposed portions of each adjacent semiconductor fin, and wherein the semiconductor material has two vertical side surfaces in direct contact with exposed sidewalls of each semiconductor fin, a bottom surface in direct contact with the exposed surface of the semiconductor material portion which is located between each adjacent semiconductor fin, and two non-vertical and non-horizontal surfaces that converge at an apex, wherein a thickness of the semiconductor material at the apex is greater than a thickness of the semiconductor material at either vertical side surface of the semiconductor material.

In some embodiments, the semiconductor device mentioned above may further include a plurality of second semiconductor fins extending upward from a topmost surface of another semiconductor material portion, wherein the another semiconductor material portion is located on the upper surface of the insulator layer, and disjoined from the semiconductor portion including the plurality of semiconductor fins. In such embodiments, the device may further include another functional gate structure straddling each second semiconductor fin and another gate spacer located on each sidewall of the another functional gate structure and also straddling each second semiconductor fin. Also, in such embodiments, the device may further include another semiconductor material located on each side of the another functional gate structure and present on an exposed surface of the another semiconductor material portion between each adjacent second semiconductor fin, wherein the another semiconductor material merges exposed portions of each adjacent second semiconductor fin, and wherein the another semiconductor material has two vertical side surfaces in direct contact with exposed sidewalls of each second semiconductor fin, a bottom surface in direct contact with the exposed surface of the another semiconductor material portion which is located between each adjacent second semiconductor fin, and two non-vertical and non-horizontal surfaces that converge at an apex, wherein a thickness of the another semiconductor material at the apex is greater than a thickness of the another semiconductor material at either vertical side surface of the another semiconductor material.

DETAILED DESCRIPTION

Figure 1A:
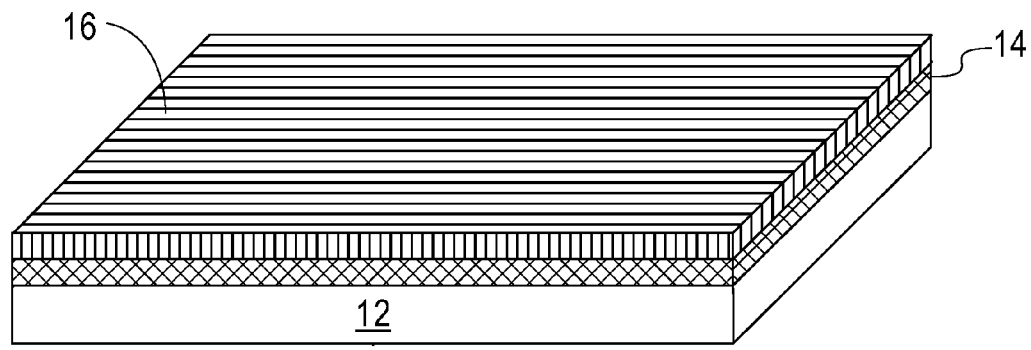
FIGS. 1A-1B are perspective views depicting some initial structures that can be employed in the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Fins for CMOS FETs are typically fabricated by etching pre-defined extremely narrow lines into a topmost silicon layer of a semiconductor-on-insulator (SOI) substrate. The length of the fins is defined by lithography, while the width of the fin is determined by a spacer technique. However, the height of the fin is typically set by the initial thickness of the topmost silicon layer of the SOI substrate. As most fabrication techniques require a complete separation of the fins, the topmost semiconductor material layer is generally etched all the way through to the underlying buried insulator layer. After gates are defined in subsequent processing, the exposed fins that make up the source drain/regions need to be thickened, even merged, to allow first metal level contacts with sufficient surface area. The thickening/merging of the S/D fin regions is typically achieved by selective epitaxy of a doped or undoped semiconductor material. However, the complete separation of the fins down to the buried insulator layer results in epitaxial growth from the <110> sidewalls of the fin, forming (111) bound shapes around the fins, and diamond-shaped cross-sections are usually observed. The merging is hindered by the slow growth rate on the (111) planes that are somewhat essential in the selective epitaxy growth process. Typically, the growth rate on (111) planes is less than (110) planes which is less than (100) planes. In some cases, the etching and deposition component of the selective epitaxy growth process can be tuned to allow other facets to form, such as, for example, (110) or (311). Occasionally, flat unfaceted growth can result from careful parameter selection. However, even if the selective epitaxy growth process is made to merge between the fins, the complete initial separation of the fins forces crystal defects such as, for example, stacking fault defects, to occur at the merging boundary and near the (111) planes. These stacking fault defects give rise to "silicide piping" that can result in much increased leakage currents. As a result, there is a need for a "perfectly" merge fin structure similar to that produced by selective epitaxy growth in embedded SiGe or Si:C, i.e., carbon doped silicon, in full-depleted SOI circuits.

Notably, this application provides a method of forming a finFET device having non-in-plane facetted and complete merged S/D regions without the presence of crystal defects such as, for example, stacking fault defects. The method of the present application is based on an integration scheme that includes an incomplete fin-height etch. In one embodiment, the incomplete fin-height etch can be achieved utilizing a timed etching process. In another embodiment, the incomplete fin-height etch can be achieved by embedding an etch stop layer between the topmost semiconductor layer and the buried insulator layer. The methods of the present application will now be described in greater detail by referring to FIGS. 1A, 1B, and 2-6. Although the description and drawings that follow illustrate forming a plurality of semiconductor fins in different device regions, the methods of the present application can be applied to cases in which a plurality of semiconductor fins is formed in a single device region.

Figure 1B:
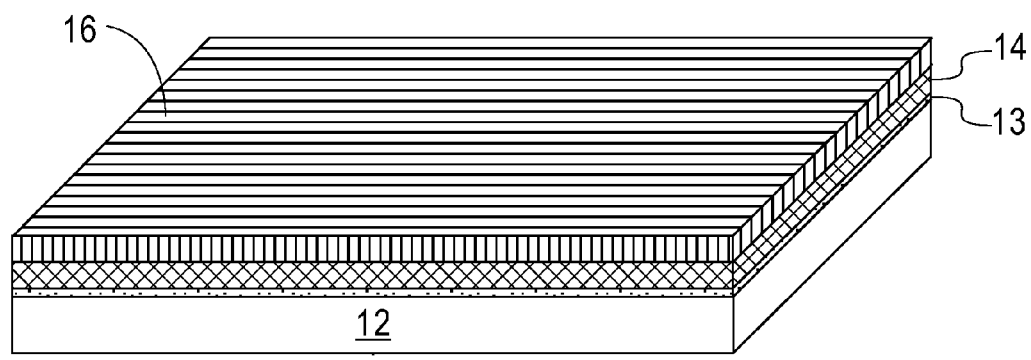

Referring first to FIGS. 1A-1B, there are illustrated some initial structures that can be employed in the present application. In particular, FIG. 1A illustrates an initial structure that includes, from bottom to top, an insulator layer 12, a topmost semiconductor layer 14, and a blanket layer of hard mask material 16. In some embodiments of the present application, a handle substrate (not shown in either FIG. 1A or FIG. 1B) is present directly beneath the insulator layer 12. The handle substrate and elements 12 and 14 of the initial structure shown in FIG. 1A can be referred to herein as a semiconductor-on-insulator material. FIG. 1B illustrates another initial structure that can be used in the present application. The another initial structure shown in FIG. 1B is similar to the initial structure shown in FIG. 1A except that a blanket layer of semiconductor etch stop material 13 is formed between the buried insulator layer 12 and the topmost semiconductor material layer 14.

When present, the handle substrate may include a first semiconductor material which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In some embodiments of the present application, the semiconductor material of the handle substrate can be a single crystalline, i.e., epitaxial, semiconductor material. The term "single crystalline" as used throughout the present application denotes a material in which the crystal lattice of the entire sample is continuous and unbroken to the edges of the sample, with no grain boundaries. In one example, the handle substrate can be a single crystalline silicon material. In some embodiments, the handle substrate is a non-semiconductor material including, for example, a dielectric material and/or a conductive material.

In some embodiments, all or portions of the handle substrate can be doped to provide at least one globally or locally conductive region (not shown) located beneath the interface between the handle substrate and the insulator layer 12. The dopant concentration in doped regions of the handle substrate can be optimized for device performance. The thickness of the handle substrate can be from 50 microns to 1 mm, although lesser and greater thicknesses can also be employed.

The insulator layer 12 can be a semiconductor oxide, a semiconductor nitride, a semiconductor oxynitride, or any multilayered stack thereof. In some embodiments, the insulator layer 12 is a silicon oxide layer. In one embodiment, the insulator layer 12 can have a thickness from 10 nm 30 to nm. In another embodiment, the insulator layer 12 can have a thickness from 2 nm to 200 nm.

The topmost semiconductor layer 14 (which can also be referred to as an SOI layer 14) includes a second semiconductor material which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In some embodiments of the present application, the second semiconductor material of the topmost semiconductor layer 14 can be a single crystalline, i.e., epitaxial, semiconductor material. In one example, the second semiconductor material of the topmost semiconductor layer 14 can be a single crystalline silicon material. In one embodiment, the second semiconductor material of the topmost semiconductor layer 14 may be comprised of a same semiconductor material as that of the handle substrate. In another embodiment, the second semiconductor material of the topmost semiconductor layer 14 may be comprised of a different semiconductor material as that of the handle substrate. In some embodiments, the topmost semiconductor layer 14 can be doped. In one embodiment, the thickness of the topmost semiconductor layer 14 can be from 50 nm to 5 nm. In another embodiment, the thickness of the topmost semiconductor layer 14 can be from 30 nm to 10 nm.

In some embodiments in which the topmost semiconductor layer 14 has a thickness that is outside one of the aforementioned ranges, the topmost semiconductor layer 14 can be thinned to a desired thickness within one of the above mentioned ranges by planarization, grinding, wet etching, dry etching, oxidation followed by oxide etching, or any combination thereof. One method of thinning a topmost semiconductor layer 14 is to oxidize the semiconductor material, such as silicon, by a thermal dry or wet oxidation process, and then wet etching the semiconductor oxide layer, such as silicon oxide, using a hydrofluoric (HF) acid mixture. This process can be repeated to achieve the desired thickness of the topmost semiconductor layer 14.

The blanket layer of semiconductor etch stop material 13 that is illustrated in FIG. 1B is comprised of a third semiconductor material that is different in composition and/or doping from the second semiconductor material of the topmost semiconductor layer 14 and, as such, the blanket layer of semiconductor etch stop material 13 has a different etch selectivity as compared to the topmost semiconductor layer 14. The third semiconductor material which forms the blanket layer of semiconductor etch stop material 13 can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In some embodiments, the blanket layer of semiconductor etch stop material 13 comprises a third semiconductor material that has an epitaxial relationship with, i.e., same crystal structure as, the second semiconductor material which comprises the topmost semiconductor layer 14. In such embodiments in which there is an epitaxial relationship among the semiconductor etch stop material 13 and the topmost semiconductor layer 14, an epitaxial growth process is used in forming one of the semiconductor etch stop material 13 and/or the topmost semiconductor layer 14.

For example, and in one embodiment in which the topmost semiconductor layer 14 is comprised of silicon, and the blanket layer of semiconductor etch stop material 13 is comprised of a silicon germanium alloy.

In another embodiment, the topmost semiconductor layer 14 may be a non-doped second semiconductor material, while the blanket layer of semiconductor etch stop material 13 comprises a doped third semiconductor material. The term "doped" as used herein to describe the doped third semiconductor material means that a dopant is present within the semiconductor etch stop material 13 such that during a subsequent etch of the non-doped second semiconductor material which is provided as the topmost semiconductor layer 14 the etch stops on the uppermost surface of the semiconductor etch stop material. The dopant may be an element from either Group IIIA (e.g., one of B, Al, Ga and/or In) or VA (e.g., one of P, As, and/or Sb) of the Periodic Table of Elements. The dopant may be present within the semiconductor etch stop material 13 in a concentration ranging from $1 \times 10^{17}$ atoms/$cm^3$ to $5 \times 10^{20}$ atoms/$cm^3$. In another example, the dopant may be present within the semiconductor etch stop material 13 in a concentration ranging from $5 \times 10^{17}$ atoms/$cm^3$ to $5 \times 10^{19}$ atoms/$cm^3$. The dopant that is present in the semiconductor etch stop material 13 may be introduced using an in-situ doping process. By "in-situ" it is meant that the dopant that provides the conductivity type of the material layer is introduced as the material layer is being formed or deposited, e.g., during the epitaxial deposition process. For example, when doping the semiconductor material concurrently with the epitaxial growth process, a gas source for the dopant is introduced to the semiconductor material being grown simultaneously with the gas source that provides the precursor for epitaxially forming the semiconductor material. In-situ doping is differentiated from ion implantation that occurs after the semiconductor material has been formed. In one example, in which the dopant that is present in the semiconductor etch stop material 13 includes boron (B), the gaseous dopant sources for in-situ doping include $B_2H_6$, $BCl_3$ and combinations thereof. In other embodiments, the dopant that is present in the semiconductor etch stop material 13 may be introduced using ion implantation after formation of a non-doped semiconductor etch stop material 13. In yet other embodiments, the dopant may be introduced by gas phase doping, or by depositing a doped sacrificial layer and diffusing the dopant from the doped sacrificial material into a non-doped semiconductor etch stop material 13.

In yet another embodiment, the topmost semiconductor layer 14 may be a doped second semiconductor material, while the blanket layer of semiconductor etch stop material 13 comprises a non-doped third semiconductor material. In this embodiment, the dopant type and doped concentration within the embodiment described above can be used for this embodiment. Also, one of the above processes can be used to introduce the dopant within the topmost semiconductor layer 14.

In one embodiment, the thickness of the blanket layer of semiconductor etch stop material 13 can be from 2 nm to 10 nm. In another embodiment, the thickness of the blanket layer of semiconductor etch stop material 13 can be from 4 nm to 6 nm.

In some embodiments of the present application, the initial structure can be formed by implanting a high-energy dopant such as, for example, oxygen into a bulk semiconductor substrate and then annealing the structure to form the insulator layer 12 of the structure. In another embodiment, the insulator layer 12 may be deposited or grown by thermal techniques prior to the formation of the topmost semiconductor layer 14. In yet another embodiment, the initial structure can be formed using a wafer-bonding technique. In one embodiment, a first wafer comprising the handle substrate and the buried insulator layer can be bonded to a second wafer including the third semiconductor material which provides the blanket layer of semiconductor etch stop material 13 and the second semiconductor material that provides the topmost semiconductor layer 14. Examples of some known processes for fabricating a structure including at least layers 12, optionally 13, and 14 which can be employed in the present application include Separation by Implanted OXygen (SIMOX) or wafer bonding using SmartCut™.

Each of the initial structures shown in FIGS. 1A and 1B also includes a blanket layer of hard mask material 16 present on an exposed surface of the topmost semiconductor layer 14. In some embodiments, the blanket layer of hard mask material 16 can be omitted. When present, the blanket layer of hard mask material provides a fin cap that prevents direct contact of the gate dielectric material portion with an uppermost surface of the fin (in such an embodiment, the gate dielectric material portion only comes into direct contact with the two sidewall surfaces of each fin); when no blanket layer of hard mask material is employed a fin cap is absent from the uppermost surface of the fin and, as such, the gate dielectric material portion can directly contact the uppermost surface of the fin (in such an embodiment, the gate dielectric material portion contact the two sidewall surfaces of each fin and the uppermost surface of each fin).

The blanket layer of hard mask material 16, which will be used hereinafter as a fin cap, can be comprised of a dielectric hard mask material such as, for example, an oxide, nitride, and/or oxynitride. In one embodiment, the blanket layer of hard mask material 16 can be comprised of silicon oxide, a silicon nitride and/or a silicon oxynitride. In one embodiment, the blanket layer of hard mask material 16 can be formed utilizing a thermal process such as, for example, a thermal oxidation or a thermal nitridation process. In another embodiment, the blanket layer of hard mask material 16 can be formed by a deposition process such as, for example, chemical vapor deposition (CVD), and plasma enhanced chemical vapor deposition (PECVD). The thickness of the blanket layer of hard mask material 16 can be from 5 nm to 50 nm, although lesser and greater thicknesses can also be employed.

Figure 2:
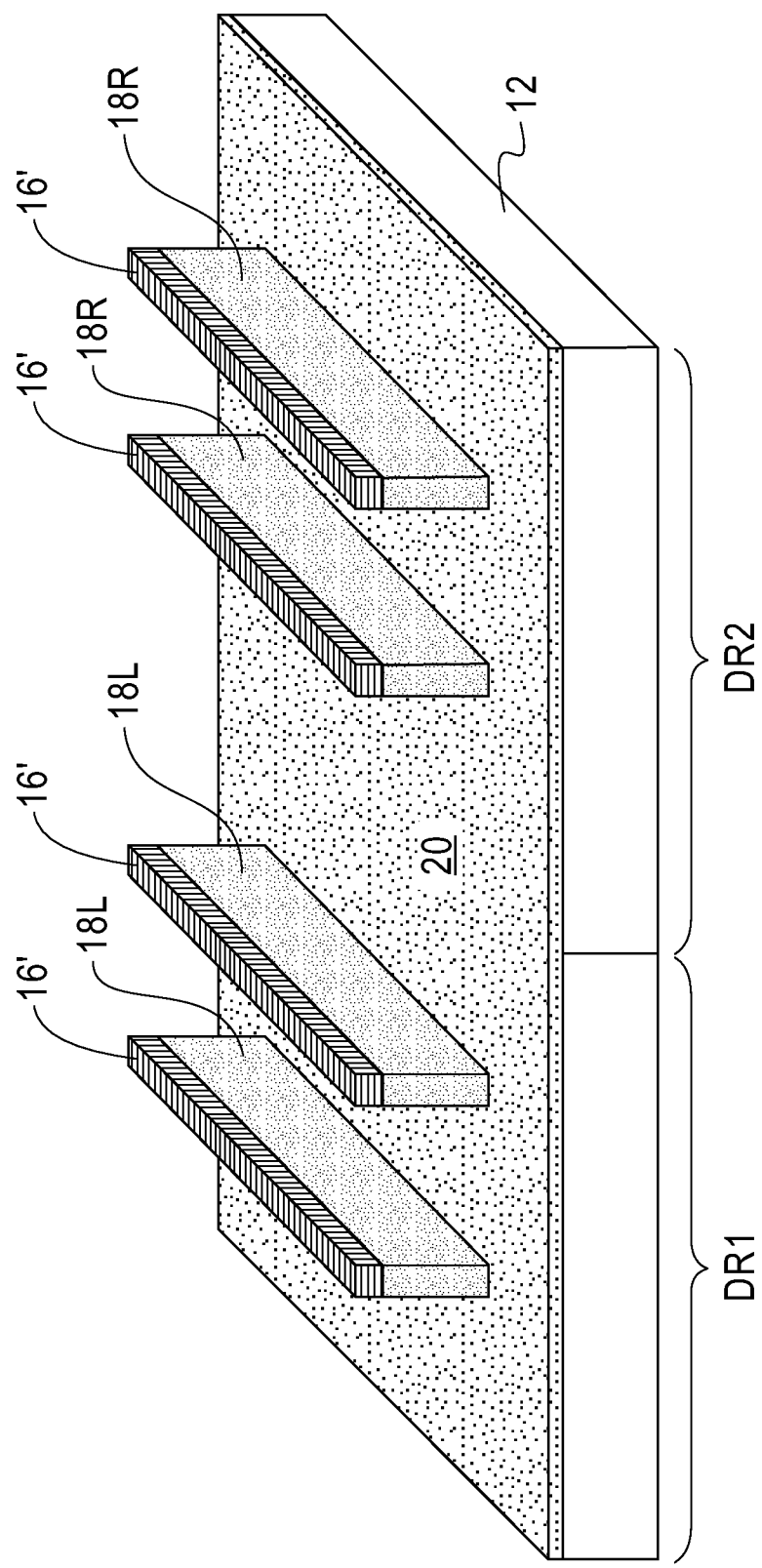
FIG. 2 is a perspective view depicting a plurality of a first set semiconductor fins and a plurality of a second set of semiconductor fins, each set of fins extending upward from a semiconductor material portion which is located on a surface of an insulator layer in accordance with an embodiment of the present application.

Referring now to FIG. 2, there is illustrated the initial structure shown in either FIG. 1A or FIG. 1B after forming a plurality of a first set of semiconductor fins 18L and a plurality of a second set of semiconductor fins 18R atop the insulator layer 12. Each set of semiconductor fins 18L, 18R extends upward from a semiconductor material portion 20 which is located on a surface of the insulator layer 12. Also, each set of semiconductor fins 18L, 18R includes a fin cap 16' located on an uppermost surface of the semiconductor fin. The fin cap 16' comprises a remaining portion of the blanket layer of hard mask material 16. Within the drawing, the plurality of the first set of the semiconductor fins 18L is formed in a first device region DR1, while the plurality of a second set of semiconductor fins 18R is formed within a second device region DR2.

In one embodiment of the present application, the semiconductor material portion 20 and each of the plurality of semiconductor fins 18L, 18R comprises the second semiconductor material that provided the topmost semiconductor layer 14 illustrated in FIG. 1A of the present application. In such an embodiment, each plurality of semiconductor fins 18L, 18R and semiconductor material portion 20 are of unitary construction and, thus, there is no material interface present between each semiconductor fin 18L, 18R and the semiconductor material portion 20.

In another embodiment of the present application, the semiconductor material portion 20 is comprised of the third semiconductor material that provided the blanket layer of semiconductor etch stop material 13 shown in FIG. 1B, while each of the plurality of semiconductor fins 18L, 18R comprises the second semiconductor material that provided the topmost semiconductor layer 14 illustrated in FIG. 1B of the present application. In such an embodiment, each plurality of semiconductor fins 18L, 18R comprises a semiconductor material that is different in composition and/or doping than that of the semiconductor material of the semiconductor material portion 20 and, thus, there is a material interface present between each semiconductor fin 18L, 18R and the semiconductor material portion 20.

The structure shown in FIG. 2 can be formed by lithography and etching. The lithographic step can include forming a photoresist (not shown) atop the blanket layer of hard mask material 16, exposing the photoresist to a desired pattern of radiation and then developing the exposed photoresist utilizing a conventional resist developer. The pattern within the photoresist is then transferred through the blanket layer of hard mask material 16 and into at least a portion of the topmost semiconductor layer 14. A single etch or multiple etching can be used to provide the structure illustrated in FIG. 2. The etch or multiple etch can include a dry etch process, a chemical wet etch process, or any combination thereof. When a dry etch is used, the dry etch can be a reactive ion etch process, a plasma etch process, ion beam etching or laser ablation. The patterned photoresist material can be removed anytime after transferring the pattern into at least the blanket layer of hard mask material 16 utilizing a conventional stripping process.

In one embodiment in which the initial structure shown in FIG. 1A is employed, the etch or etching steps include(s) a timed etching process in which the duration of the etch is controlled such that only a portion of the topmost semiconductor layer 14 is removed, while maintaining another portion of the topmost semiconductor layer 14 on the insulator layer 12. In one embodiment, a timed reactive ion etch can be used. In this embodiment, the remaining another portion of the topmost semiconductor layer 14 can be referred to as semiconductor material portion 20. In this embodiment, the semiconductor material portion 20 which is comprised of the remaining non-etched portion of the topmost semiconductor layer 14 has a thickness that is from 4 nm to 6 nm.

In another embodiment in which the initial structure shown in FIG. 1B is employed, the etch or etching steps include(s) an etching process which selectively removes the exposed portions of the topmost semiconductor layer 14 relative to the blanket layer of semiconductor etch stop material 13. By selective etch it is meant that the rate of material removal for a first material, e.g., the topmost semiconductor layer 14, is greater than the rate of removal for at least another material of the structure, e.g., the semiconductor etch stop material 13, to which the material removal process is being applied. For example, in one embodiment, a selective etch may include an etch chemistry that removes a first material selectively to a second material by a ratio of 10:1 or greater. In one embodiment, reactive ion etching may be employed to selectively etch the exposed portions of the topmost semiconductor layer 14 relative to the semiconductor etch stop material 13. In this embodiment, the blanket layer of semiconductor etch stop material can be referred to as semiconductor material portion 20. In this embodiment, the semiconductor material portion 20 has a thickness that substantially equal to the initial thickness of the blanket layer of semiconductor etch stop material 13; by "substantially equal" it is meant that the semiconductor material portion 20 of this embodiment has a thickness than is the same as, or within 2 nm from, the original thickness of the blanket layer of semiconductor etch stop material 13.

In one example, each semiconductor fin within the plurality of the first set of semiconductor fins 18L and the plurality of the second set of semiconductor fins 18R has a height, as measured from a topmost surface of the semiconductor material portion 20 to the topmost surface of the semiconductor fin, of from 5 nm to 30 nm and a width, as measured from one sidewall surface to an opposing sidewall surface, of from 20 nm to 5 nm. In another example, each semiconductor fin within the plurality of the first set of semiconductor fins 18L and the plurality of the second set of semiconductor fins 18R has a height, as measured from a topmost surface of the semiconductor material portion 20 to the topmost surface of the semiconductor fin, of from 10 nm to 25 nm and a width, as measured from one sidewall surface to an opposing sidewall surface, of from 15 nm to 7 nm.

Figure 3:
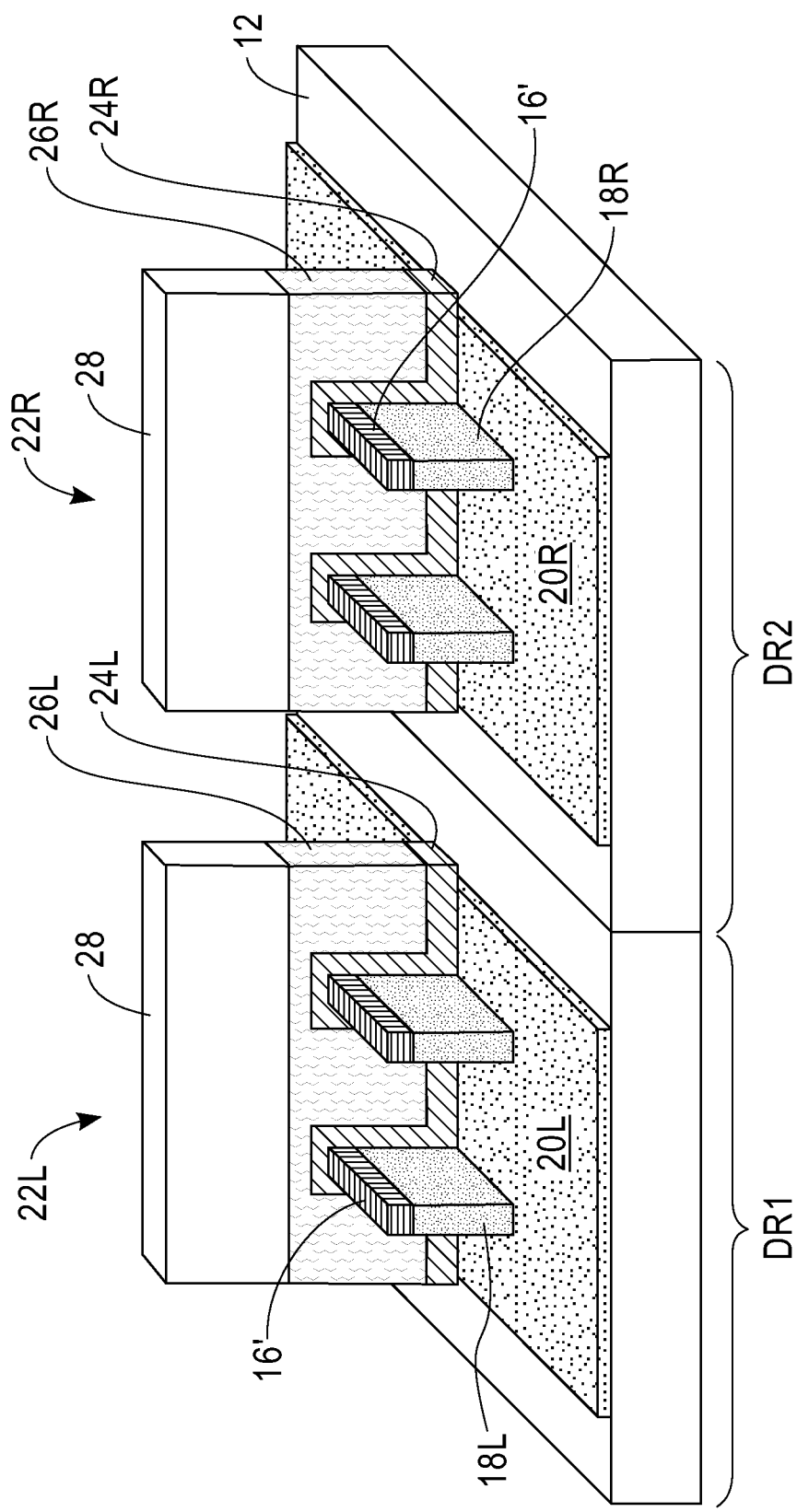
FIG. 3 is perspective view depicting the structure of FIG. 2 after forming a first gate structure that straddles the first set of semiconductor fins, and a second gate structure that straddles the second set of semiconductor fins in accordance with an embodiment of the present application.

Referring to FIG. 3, there is illustrated the structure of FIG. 2 after forming a first gate structure 22L that straddles each of the first set of semiconductor fins 18L, and a second gate structure 22R that straddles each of the second set of semiconductor fins 18R in accordance with an embodiment of the present application. In some embodiments (and as shown in the drawings), the first gate structure 22L, 22R is a functional gate structure. By "functional gate structure" it is meant, a structure used to control output current (i.e., flow of carriers in a channel) of a semiconductor device through an electrical field or, in some instances, a magnetic field. In such an embodiment, each gate structure 22L, 22R includes a gate dielectric material portion 24L, 24R, and a gate conductor material portion 26L, 26R. An optional gate cap 28 can be located on each of the gate conductor material portions 26L, 26R. It is noted that each gate structure is perpendicular to the semiconductor fins.

In other embodiments (not shown in the drawings), the first gate structure 22L, 22R can be a sacrificial gate structure which is formed at this point of the present application utilizing replacement gate technology. The sacrificial gate structure may be composed of a semiconductor material or other sacrificial material. Later in the process sequence of the present application, the sacrificial gate structure is removed and replaced with a functional gate structure having a gate dielectric material portion and a gate conductor material portion as described above. In the present application, the sacrificial gate structure is removed after exposed portions of the semiconductor fins are merged.

Prior to forming the gate structures, the semiconductor material portion 20 can be patterned by lithography and etching to provide a semiconductor material portion 20L within the first device region DR1, and another semiconductor material portion 20R within the second device region DR2, wherein the semiconductor material portion 20L is disjoined from the another semiconductor portion 20R.

In one embodiment, the first and second gate structures 22L, 22R can be formed by forming a gate material stack of, from bottom to top, a blanket layer of gate dielectric material, a blanket layer of a gate conductor material, and optionally a blanket layer of a gate cap material.

The blanket layer of gate dielectric material that is formed can include a semiconductor oxide, semiconductor nitride, semiconductor oxynitride, or a high k material having a dielectric constant greater than silicon oxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g. silicon oxide, and a high k gate dielectric can be formed.

The blanket layer of gate dielectric material can be formed by any deposition technique including, for example, chemical vapor deposition (CVD), plasma enhanced chemical vapor deposition (PECVD), physical vapor deposition (PVD), and sputtering, atomic layer deposition. In some embodiments, a thermal growth technique can be used in forming the blanket layer of gate dielectric material. In one embodiment of the present application, the blanket layer of gate dielectric material can have a thickness in a range from 1 nm to 10 nm. Other thicknesses that are lesser than or greater than the aforementioned thickness range can also be employed for the blanket layer of gate dielectric material.

After providing the blanket layer of gate dielectric material, a blanket layer of gate conductor material can be formed atop the blanket layer of gate dielectric material. The blanket layer of gate conductor material can include any conductive material including, for example, a doped semiconductor-containing material, (i.e., doped polysilicon or doped SiGe), an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. The blanket layer of gate conductor material can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes. When a metal silicide is formed, a conventional silicidation process is employed. In one embodiment, the blanket layer of gate conductor material has a thickness from 1 nm to 100 nm. Other thicknesses that are lesser than or greater than the aforementioned thickness range can also be employed for the blanket layer of gate conductor material.

A blanket layer of gate cap material can be formed atop the blanket layer of gate conductor material. In some embodiments, the blanket layer of gate cap material is optional. When present, the blanket layer of gate cap material comprises a same or different material as employed for the blanket layer of hard mask material 16. In one embodiment, the blanket layer of gate cap material comprises a different material as employed for the blanket layer of hard mask material 16. For example, the blanket layer of gate cap material can be composed of silicon nitride, while the blanket layer of hard mask material 16 can be composed of silicon oxide. The blanket layer of gate cap material can be formed utilizing one of the techniques mentioned above in forming the blanket layer of hard mask material 16. In one embodiment, the blanket layer of gate cap material has a thickness from 20 nm to 100 nm. Other thicknesses that are lesser than or greater than the aforementioned thickness range can also be employed for the blanket layer of gate cap material.

The gate material stack including the blanket layers of gate dielectric material, gate conductor material, and optional gate cap material is then patterned by lithography and etching. The lithographic step can include forming a photoresist (not shown) atop the blanket layer of gate cap material (or the blanket layer of gate conductor, if no gate cap material is present), exposing the photoresist to a desired pattern of radiation and then developing the exposed photoresist utilizing a conventional resist developer. The pattern within the photoresist is then transferred through the blanket layer of gate cap material and into underlying blanket layers of gate conductor material and gate dielectric material. A single etch or multiple etching can be used to provide the structure illustrated in FIG. 3. The etch or multiple etch can include a dry etch process, a chemical wet etch process, or any combination thereof. When a dry etch is used, the dry etch can be a reactive ion etch process, a plasma etch process, ion beam etching or laser ablation. In one embodiment, the patterned photoresist material can be removed after transferring the pattern into at least the blanket layer of gate material utilizing a conventional stripping process.

After patterning the gate material stack, the remaining portions of the blanket layer of gate dielectric material provide gate dielectric material portions 24L, 24L, the remaining portions of the blanket layer of gate conductor material provide gate conductor material portions 26L, 26R and, if present, the remaining portion of the gate cap material provides gate cap 28.

In another embodiment, a block mask can be formed in one of the device regions, the first or second gate structure is formed in the another of the device regions not including the block mask, the block mask is removed, another block mask is formed in the device region including the first or second gate structure, the other of the first and second gate structure not previously formed is formed into the another device region, and the another block mask can be removed. This particular embodiment permits the formation of a first gate structure 22L that can have at least one different material portion, i.e., gate dielectric material portion and/or gate conductor portion, that differs from the gate dielectric material portion and/or gate conductor portion of the second gate structure 22R.

It is noted that the first gate structure 22L that is provided straddles each semiconductor fin in the plurality of the first set of semiconductor fins 18L, while leaving portions of each semiconductor fin in the plurality of the first set of semiconductor fins 18L exposed. Likewise, the second gate structure 22R that is provided straddles each semiconductor fin in the plurality of the second set of semiconductor fins 18R, while leaving portions of each semiconductor fin in the plurality of the second set of semiconductor fins 18R exposed.

Figure 4:
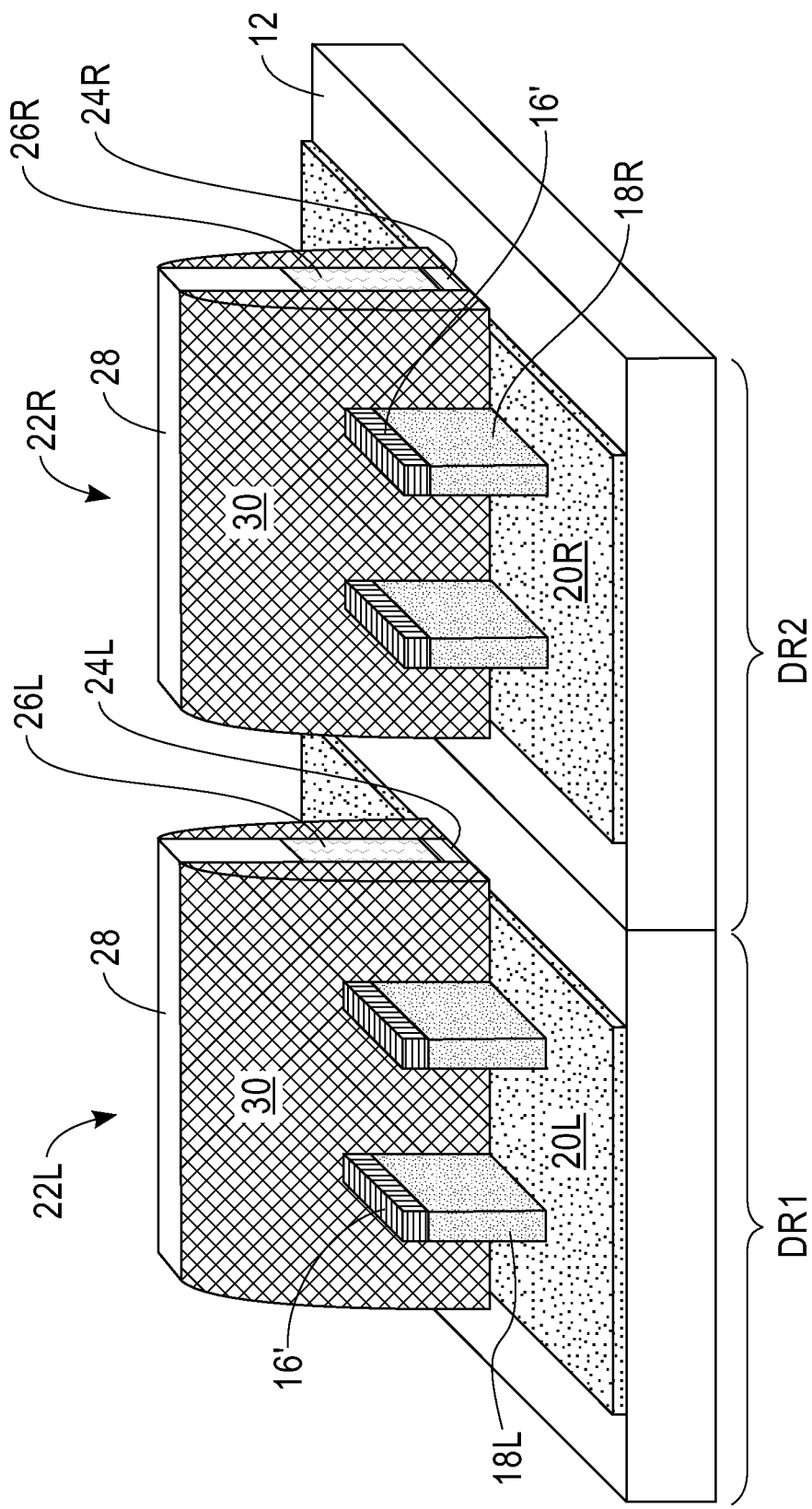
FIG. 4 is perspective view depicting the structure of FIG. 3 after forming a dielectric spacer on sidewalls of each gate structure in accordance with an embodiment of the present application.

Referring now to FIG. 4, there is illustrated the structure of FIG. 3 after forming a dielectric spacer 30 on sidewalls of each gate structure 22L, 22R in accordance with an embodiment of the present application. Each dielectric spacer also straddles each semiconductor fin, has a sidewall surface that is in direct contact with sidewalls of the gate structures and has a base that is located at least partially atop each semiconductor material portion 20L, 20R. Each gate spacer 30 can be provided by depositing a layer of a spacer dielectric material (such as, for example, one of the materials mentioned above for the blanket layer of hard mask material 16) and then performing an anisotropic etch. As shown, each spacer 30 has a width at the base that is greater than a width at the tip of the spacer. In one embodiment, each spacer 30 comprises a spacer dielectric material that differs from that of the gate cap 28.

In some embodiments, the exposed portions which are not covered by gate structure 22L, 22R and gate spacer 30, of each of the semiconductor fins 18L, 18R can be doped at this point of the present application so as to form source/drain regions within the exposed portions of each semiconductor fin. The doping of the exposed portions of each semiconductor fin can be performed by gas phase doping, plasma doping, or a gas cluster ion beam process. As will be understood by those skilled in the art, the exposed portions of each semiconductor fin on one side of the gate structure will serve as the source region of the device, while the exposed portions of each semiconductor fin on the other side of the gate structure will serve as the drain region of the device.

Figure 5:
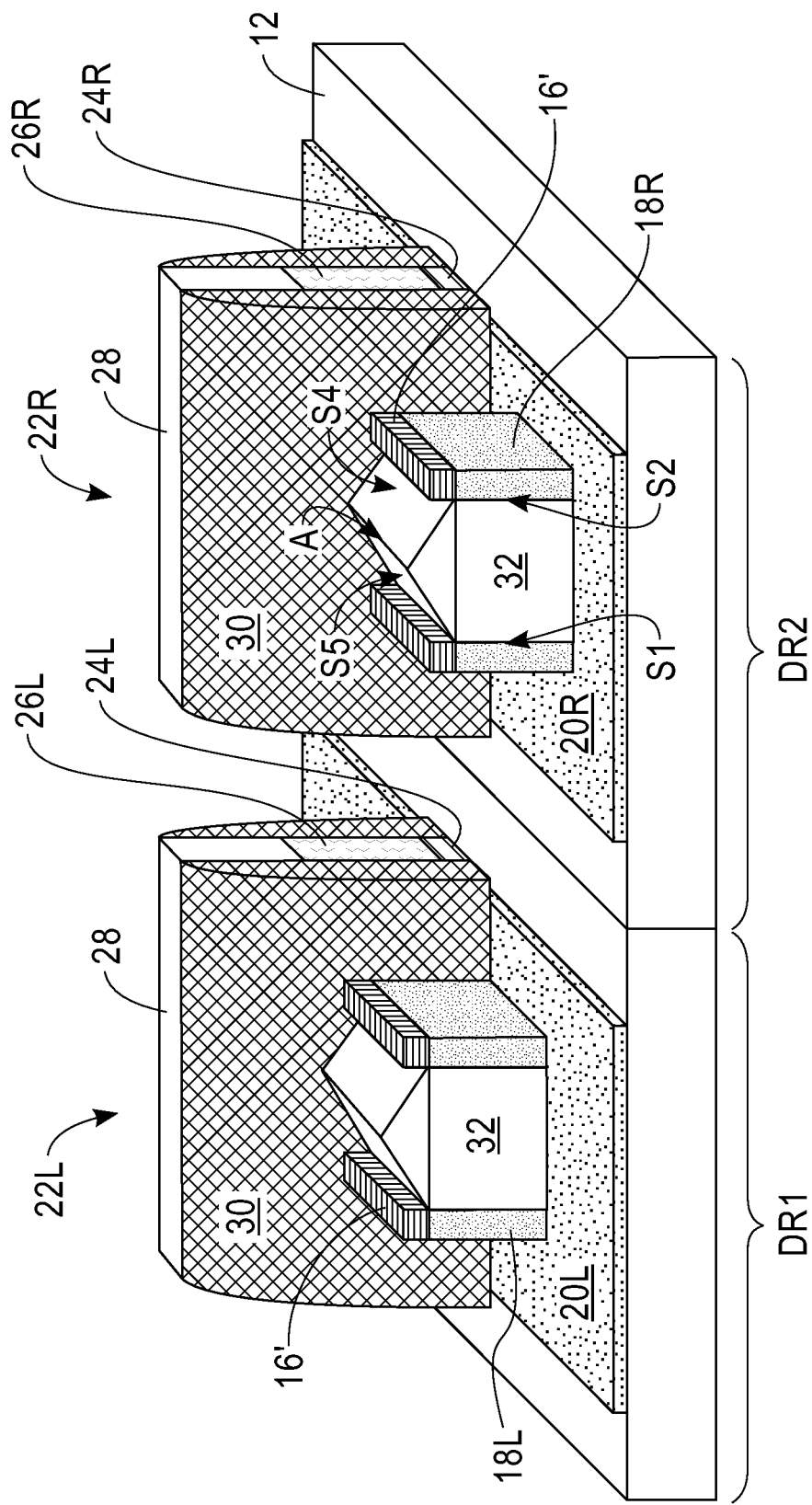
FIG. 5 is perspective view depicting the structure of FIG. 4 after merging adjacent semiconductor fins of the first set of semiconductor fins and adjacent semiconductor fins of the second set of semiconductor fins in accordance with an embodiment of the present application.

Referring now to FIG. 5, there is illustrated the structure of FIG. 4 after merging adjacent and exposed edge portions of each of the semiconductor fins of the first set of semiconductor fins 18L and adjacent and exposed edge portions of each of semiconductor fins of the second set of semiconductor fins 18R in accordance with an embodiment of the present application. In the drawing, reference numeral 32 denotes a semiconductor material that is formed and used to merge the fins. Semiconductor material 32 can also be reference to herein as the S/D contact regions of the fin structure. Semiconductor material (not shown) is also formed on the outside of the outermost fins. The semiconductor material that is formed on the outside of the outermost fins has a different structure than the semiconductor material 32 that is formed between neighboring semiconductor fins. It is noted that the semiconductor material 32 located on one side of the gate structure 22L, 22R can serve as the source contact region of the fin structure within the specific device region, while the semiconductor material 32 located on the other side of the gate structure 22L, 22R can serve as the drain contact region of the fin structure with the specific device region. In the drawings, and by way of example, the semiconductor material 32 shown in each of the device regions represents a source contact region of the fin structure, while the drain contact region (not shown) is located on the other side of the gate structure in each of the device regions.

The semiconductor material 32 that is used in forming the source and drain contact regions are formed by a selective epitaxial growth process on the exposed semiconductor material portion 20 which is present between each of the exposed edge portions of the semiconductor fins. That is, the semiconductor material 32 is formed by a bottom-up epitaxial growth process, rather than from exposed sidewalls of each of the semiconductor fins, as is typically the case in prior art processes. As such, the semiconductor material 32 has an epitaxial relationship with the exposed surface of the semiconductor material portion (20L, 20R) which is present between each of the exposed edge portions of the semiconductor fins, rather than the sidewall surfaces of each of the semiconductor fins. In some embodiments (not show), the gate cap 28 can be is removed from the gate conductor material portion 26L, 26R prior to selective epitaxial growth utilizing a conventional stripping process. In such an embodiment, a semiconductor material layer can be formed on the exposed surface of the gate conductor material portion 26L, 26R.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon oxide or silicon nitride surfaces.

Examples of various epitaxial growth process apparatuses that are suitable for use in forming the semiconductor material 32 of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the semiconductor material 32 typically ranges from 550° C. to 900° C. Although higher temperature typically results in faster deposition, the faster deposition may result in crystal defects and film cracking.

A number of different sources may be used for the deposition of epitaxial semiconductor material. In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In some embodiments, the epitaxial growth of the semiconductor material 32 can include a dopant gas used in conjunction with the source gas; such a process may be referred to herein as an in-situ doping epitaxial growth process. The dopant gas that can be present in the epitaxial growth process provides a conductivity type, either n-type or p-type, to the semiconductor material 32 used as the source and drain contacts regions. When a semiconductor material 32 of an n-type conductivity is to be formed, the dopant gas includes at least one n-type dopant, e.g., phosphorus or arsenic. For example, when phosphorus is the n-type dopant, the dopant gas can be phosphine ($PH_3$), and when arsenic is the n-type dopant, the dopant gas can be arsine ($AsH_3$). In one example, when the conductivity type dopant is n-type, the dopant gas include phosphine gas ($PH_3$) present in a ratio to silane ($SiH_4$) ranging from 0.00001% to 2%. In another example, when the conductivity type dopant is n-type, the dopant gas include phosphine gas ($PH_3$) present in a ratio to silane ($SiH_4$) ranging from 0.0001% to 0.1%.

When a semiconductor material layer 32 of a p-type conductivity is to be formed, a dopant gas including at least one p-type dopant, e.g., B, is employed as the semiconductor material 32. For example, when boron is the p-type dopant, the dopant gas can be diborane ($B_2H_6$). In one embodiment, wherein the conductivity type dopant is p-type, the dopant gas may be diborane ($B_2H_6$) present in a ratio to silane ($SiH_4$) ranging from 0.00001% to 2%. In another embodiment, wherein the conductivity type dopant is p-type, the dopant gas may be diborane ($B_2H_6$) present in a ratio to silane ($SiH_4$) ranging from 0.0001% to 0.1%. In yet another embodiment, in which the conductivity type dopant is p-type, the dopant gas for may be trimethylboron (TMB) present in a ratio to silane ($SiH_4$) ranging from 0.1% to 10%.

In one embodiment, in which the semiconductor material 32 includes a p-type dopant, the p-type dopant is present within the semiconductor material 32 in a concentration ranging from $1\times10^{19}$ atoms/cm$^3$ to $10^{21}$ atoms/cm$^3$. In another embodiment, in which the semiconductor material 32 contains p-type dopant, the p-type dopant is present in a concentration ranging from $1\times10^{20}$ atoms/cm$^3$ to $8\times10^{20}$ atoms/cm$^3$. In one embodiment, in which the semiconductor material 32 contains an n-type dopant, the n-type dopant is present in the semiconductor material 32 in a concentration ranging from $1\times10^{19}$ atoms/cm$^3$ to $10^{21}$ atoms/cm$^3$. In another embodiment, in which doped semiconductor material 32 contains an n-type dopant, the n-type dopant is present in a concentration ranging from $1\times10^{20}$ atoms/cm$^3$ to $8\times10^{20}$ atoms/cm$^3$. The dopant within the semiconductor material 32 can be uniformly present or present as a gradient.

In some embodiments of the present application, the semiconductor material 32 can be hydrogenated. When hydrogenated, a hydrogen source is used in conjunction with the other source gases and the amount of hydrogen that is present within the semiconductor material 32 can be from 1 atomic percent to 40 atomic percent. In another embodiment, carbon can be present in the semiconductor material 32. When present, a carbon source (such as, for example, mono-methylsilane) is used in conjunction with the other source gases and carbon, C, can be present in the semiconductor material 32 in range from 0 atomic % to 4 atomic %.

In some embodiments, a non-doped semiconductor material 32 can be epitaxial grown without the inclusion of a dopant source, and dopants can be introduced, but not necessarily always, in the non-doped semiconductor material by one of ion implantation and/or gas phase doping.

The thickness of the semiconductor material 32 may range from 2 nm to 100 nm. In another embodiment, the thickness of the semiconductor material 32 ranges from 5 nm to 50 nm. The semiconductor material 32 that is provided has two vertical side surfaces, S1, and S2, in direct contact with exposed sidewalls of each semiconductor fin 18L, 18R, a bottom surface, S3, in direct contact with the exposed surface of the semiconductor material portion 20L, 20R which is located between each adjacent semiconductor fin 18L, 18R, and two non-vertical and non-horizontal surfaces, S4, S5, which converge at an apex, A. In accordance with an embodiment of the present application, a thickness of the semiconductor material 32 at the apex, A, is greater than a thickness of the semiconductor material 32 at either vertical side surface, S1, and S2, of the semiconductor material 32. As can be seen in FIG. 5, one end portion of semiconductor material 32 directly contacts a portion of the gate spacer 30, wherein another end portion of the semiconductor material 32 is exposed. The finFET structure that is shown in FIG. 5 has non-in-plane facetted and complete merged S/D regions (i.e., semiconductor material 32) without the presence of any crystal defects.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor device comprising:
   providing a structure comprising a topmost semiconductor layer located on a surface of an insulator layer;
   partially etching the topmost semiconductor layer to form a plurality of semiconductor fins extending upward from a topmost surface of a semiconductor material portion;
   forming a gate structure and adjacent gate spacers straddling each semiconductor fin, wherein bottommost horizontal surface portions of said gate structure and said gate spacers are in direct physical contact with said topmost surface of said semiconductor material portion; and
   epitaxially growing a semiconductor material from an exposed portion of said topmost surface of the semiconductor material portion which is located between each adjacent semiconductor fin, wherein said semiconductor material merges exposed portions of each adjacent semiconductor fin.

2. The method of claim 1, wherein said partially etching the topmost semiconductor layer comprises a timed etching process.

3. The method of claim 2, wherein said semiconductor material portion and said plurality of fins comprise a same semiconductor material and are of unitary construction.

4. The method of claim 1, wherein said gate structure is a functional gate structure, and said forming the gate structure comprises:
   forming a gate material stack of, from bottom to top, a blanket layer of gate dielectric material, a blanket layer of gate conductor material, and a blanket layer of dielectric cap material; and
   patterning said gate material stack by lithography and etching.

5. The method of claim 1, wherein said gate structure is a replacement gate structure, and said forming the gate structure comprises at least forming a sacrificial material.

6. The method of claim 5, wherein said sacrificial material is removed after said epitaxially growing the semiconductor material, and replaced with a functional gate structure comprising a gate dielectric material portion and a gate conductor portion.

7. The method of claim 1, wherein said semiconductor material has two vertical side surfaces in direct contact with exposed sidewalls of each semiconductor fin, a bottom surface in direct contact with the exposed portion of said uppermost surface of the semiconductor material portion which is located between each adjacent semiconductor fin, and two non-vertical and non-horizontal surfaces that converge at an apex, wherein a thickness of the semiconductor material at the apex is greater than a thickness of the semiconductor material at either vertical side surface of the semiconductor material.

8. A method of forming a semiconductor device comprising:
   providing a structure comprising, from bottom to top, an insulator material, a semiconductor etch stop material and a topmost semiconductor layer, wherein said semiconductor etch stop material comprises a semiconductor material having a different etch rate than the topmost semiconductor layer;
   etching the topmost semiconductor layer, stopping on an uppermost surface of the semiconductor etch stop material, to form a plurality of semiconductor fins extending upward from said uppermost surface of said semiconductor etch stop material;
   forming a gate structure and adjacent gate spacers straddling each semiconductor fin, wherein bottommost horizontal surface portions of said gate structure and said gate spacers are in direct physical contact with said uppermost surface of said semiconductor etch stop material; and
   epitaxially growing a semiconductor material from an exposed portion of said uppermost surface of the semiconductor etch stop material which is located between each adjacent semiconductor fin, wherein said semiconductor material merges exposed portions of each adjacent semiconductor fin.

9. The method of claim 8, wherein said semiconductor etch stop material and said topmost semiconductor layer comprise a different semiconductor material composition.

10. The method of claim 8, wherein said gate structure is a functional gate structure, and said forming the gate structure comprises:
    forming a gate material stack of, from bottom to top, a blanket layer of gate dielectric material, a blanket layer of gate conductor material, and a blanket layer of dielectric cap material; and
    patterning said gate material stack by lithography and etching.

11. The method of claim 8, wherein said gate structure is a replacement gate structure, and said forming the gate structure comprises at least forming a sacrificial material.

12. The method of claim 11, wherein said sacrificial material is removed after said epitaxially growing the semiconductor material, and replaced with a functional gate structure comprising a gate dielectric material portion and a gate conductor portion.

13. The method of claim 8, wherein said semiconductor material has two vertical side surfaces in direct contact with exposed sidewalls of end portions of each semiconductor fin, a bottom surface in direct contact with the exposed portion of said uppermost surface of the semiconductor material portion which is located between each adjacent semiconductor fin, and two non-vertical and non-horizontal surfaces that converge at an apex, wherein a thickness of the semiconductor material at the apex is greater than a thickness of the semiconductor material at either vertical side surface of the semiconductor material.

14. The method of claim 1, wherein said topmost surface of said semiconductor material portion is vertically offset and located beneath a topmost surface of each semiconductor fin.

15. The method of claim 7, wherein said apex is not located directly above a topmost surface of any semiconductor fin.

16. The method of claim 8, wherein said uppermost surface of said semiconductor etch stop material is vertically offset and located beneath a topmost surface of each semiconductor fin.

17. The method of claim 13, wherein said apex is not located directly above a topmost surface of any semiconductor fin.

* * * * *